United States Patent
Doan et al.

(10) Patent No.: US 7,514,012 B2
(45) Date of Patent: Apr. 7, 2009

(54) PRE-OXIDIZATION OF DEFORMABLE ELEMENTS OF MICROSTRUCTURES

(75) Inventors: Jonathan Doan, Mountain View, CA (US); Satyadev R. Patel, Sunnyvale, CA (US); Dmitri Simonian, Sunnyvale, CA (US)

(73) Assignee: Texas Instruments Incorporated, Dallas, TX (US)

( * ) Notice: Subject to any disclaimer, the term of this patent is extended or adjusted under 35 U.S.C. 154(b) by 747 days.

(21) Appl. No.: 10/766,776

(22) Filed: Jan. 27, 2004

(65) Prior Publication Data

US 2005/0161432 A1  Jul. 28, 2005

(51) Int. Cl.
  *C23F 1/00* (2006.01)
  *H01L 21/00* (2006.01)
(52) U.S. Cl. .............. 216/2; 216/24; 216/58; 216/63; 216/67; 216/79; 359/290; 359/291; 359/292; 359/293
(58) Field of Classification Search .......... 216/2, 216/24, 58, 63, 67, 79
  See application file for complete search history.

(56) References Cited

U.S. PATENT DOCUMENTS

| | | | |
|---|---|---|---|
| 5,057,187 A * | 10/1991 | Shinagawa et al. | 438/725 |
| 5,287,096 A | 2/1994 | Thompson et al. | |
| 5,411,769 A | 5/1995 | Hornbeck | |
| 5,426,070 A | 6/1995 | Shaw et al. | |
| 5,447,600 A | 9/1995 | Webb | |
| 5,512,374 A | 4/1996 | Wallace et al. | |
| 5,709,802 A | 1/1998 | Furuhata et al. | |
| 5,835,256 A | 11/1998 | Huibers | |
| 5,936,758 A | 8/1999 | Fisher et al. | |
| 5,939,785 A | 8/1999 | Klonis et al. | |
| 6,024,801 A | 2/2000 | Wallace et al. | |
| 6,046,840 A | 4/2000 | Huibers | |
| 6,086,726 A | 7/2000 | Renk et al. | |
| 6,180,543 B1 * | 1/2001 | Yu et al. | 438/787 |
| 6,204,085 B1 | 3/2001 | Strumpell et al. | |
| 6,259,551 B1 | 7/2001 | Jacobs | |
| 6,300,294 B1 | 10/2001 | Robbins et al. | |
| 6,376,787 B1 | 4/2002 | Martin et al. | |
| 6,396,975 B1 | 5/2002 | Wood et al. | |
| 6,464,892 B2 | 10/2002 | Moon et al. | |
| 6,475,570 B2 | 11/2002 | Jacobs | |
| 6,492,309 B1 | 12/2002 | Behr et al. | |
| 6,804,039 B1 * | 10/2004 | Doan et al. | 359/291 |
| 6,844,959 B2 | 1/2005 | Huibers et al. | |
| 6,867,897 B2 | 3/2005 | Patel et al. | |
| 2001/0040675 A1 * | 11/2001 | True et al. | 355/77 |
| 2002/0063322 A1 | 5/2002 | Robbins et al. | |

(Continued)

OTHER PUBLICATIONS

Wolf et al., Silicon Processing for the VLSI Era, 1986, Lattice Press, vol. 1, pp. 179, 180, 200-201, 209-211, 216-219, 230-232, 374, 564, 570.*

(Continued)

*Primary Examiner*—Shamim Ahmed
(74) *Attorney, Agent, or Firm*—Wade James Brady, III; Frederick J. Telecky, Jr.

(57) ABSTRACT

The present invention discloses a method for processing a deformable element of a microstructure for reducing the plastic deformation by oxidizing the deformable element. The method of the present invention can be performed at a variety of stages of the fabrication and packaging processes.

117 Claims, 3 Drawing Sheets

U.S. PATENT DOCUMENTS

| | | |
|---|---|---|
| 2002/0132389 A1 | 9/2002 | Patel et al. |
| 2003/0036215 A1 | 2/2003 | Reid |
| 2003/0064149 A1 | 4/2003 | Miller |
| 2003/0124462 A1 | 7/2003 | Miller |
| 2003/0166342 A1 | 9/2003 | Chinn et al. |
| 2004/0012838 A1 | 1/2004 | Huibers |
| 2004/0100594 A1 | 5/2004 | Huibers et al. |
| 2004/0100677 A1 | 5/2004 | Huibers et al. |
| 2004/0125346 A1 | 7/2004 | Huibers |
| 2004/0156090 A1 | 8/2004 | Patel et al. |

OTHER PUBLICATIONS

Callister, Materials Science and Engineering, 1997, John Wiley & Sons, 4th ed., pp. 592, 593, 601.*

S. Mubassar Ali, et al., Use of Thermal Cycling to Reduce Adhesion of Ots Coated MEMS Cantilevers, 2003, pp. 151-162.

Michael R. Houston et al., Self-Assembled Monlayer Films as Durable Anti-Stiction Coatings for Polysilicon Microstructures, 1996, pp. 42-47.

In-Ha Sung, et al., MICRO/NANO-Tribological Characteristics of Self-Assembled Monolayer and Its Application in NANO-Structure Fabrication, 2003, pp. 808-818.

Uthara Srinivasan, et al., Lubrication of Polysilicon Micromechanisms with Self-Assembled Monolayers, 1998, pp. 156-161.

Uthara Srinivasan, et al., Alkyltrichlorosilane-Based Self-Assembled Monolayer Films for Stiction Reduction In Silicon Micromachines, 1998, pp. 252-260.

M.P. de Boer et al., Adhesion, Adhesion Hysteresis and Friction In MEMS Under Controlled Humidity Ambients, 1998, pp. 127-129.

C. G. Khan Malek, et al., Adhesion Promotion Between Poly(Methylmethacrylate) and Metallic Surfaces for Liga Evaluated By Shear Stress Measurements, 1998, pp. 3543-3546.

W. Robert Ashurst, et al., Wafer Level Anti-Stiction Coatings for MEMS., Sensors and Actuators A 104 (2003), pp. 213-221.

W. Robert Ashurst et al., Vapor Phase Anti-Stiction Coatings for MEMS, pp. 1-6, no date provided.

W. Robert Ashurst, et al., Nanometer-Thin Titania Films with Sam-Level Sticktion and Superior Wear Resisitance for Reliable MEMS Performance, 4 pgs, no date provided.

B.C. Bunker, et al., The Impact of Solution Agglomeration on the Deposition of Self-Assembled Monolayers, 2000 American Chemical Society, pp. 7742-7751.

W. Robert Ashurst, et al., Alkene Based Monolayer Films as Anti-Stiction Coatings for Polysilicon MEMS, Berkeley Sensor & Actuator Center, 4 pgs, no date provided.

S Imad-Uddin Ahmed, et al., Using Self Assembled Monolayers to Reduce Friction and Wear in Polysilicon Based MEMS, 2000, pp. 1-18.

Uthara Srinivasan, et al., Self Addressed Fluorocarbon Films for Enhanced Stiction Reduction, 1997 ieee, pp. 1399-1402.

* cited by examiner

PRE-OXIDIZATION OF DEFORMABLE ELEMENTS OF MICROSTRUCTURES

TECHNICAL FIELD OF THE INVENTION

The present invention is related generally to the art of microstructures, and, more particularly, to processing deformable elements of microelectromechanical devices.

BACKGROUND OF THE INVENTION

Microstructures having deformable elements, such as microelectromechanical devices may suffer from device failure when the deformable elements experience plastic deformation that exceeds a tolerable amount. For example, a micromirror-based spatial light modulator is a type of microelectromechanical device and comprises an array of micromirrors. Each micromirror has a mirror plate attached to a hinge such that the mirror plate can rotate. In operation, the mirror plate rotates in responses to an electrostatic field, and the hinge deforms. Mechanical properties of the deformable hinge and the attachment of the hinge to the mirror plate determine the operation of the micromirror and thus, the performance of the spatial light modulator.

Therefore, a method is desired to process the deformable element of the microstructure for reducing the plastic deformation during operation so as to improve the life time of the microstructure.

SUMMARY OF THE INVENTION

In view of the forgoing, the present invention teaches a method for processing the deformable element of the microstructure for reducing plastic deformation by oxidizing the deformable element. The processing method can be performed at different stages of the fabrication and packaging process. Specifically, the method can be performed before or after patterning of the deformable element during the fabrication. The method can also be performed when a portion of the sacrificial layers is removed or after the sacrificial layers are fully removed. The method can also be implemented after the microstructure has been released and before packaging the released microstructure. Moreover, the method of the present invention can be performed during the packaging stage but before the package is hermetically sealed.

In an embodiment of the invention, a method for processing a deformable element of a microstructure is disclosed. The method comprises: deflecting the deformable element to a deflected state; and oxidizing the deformable element in an oxygen-containing gas other than air while the deformable element is in the deflected state.

In another embodiment of the invention, a method of processing a deformable element of a microelectromechanical device is disclosed, wherein the deformable element exhibits a droop at a natural rest state. The method comprises: oxidizing a material of the deformable element equivalent to at least 20 percent in thickness or volume of the deformable element by exposing the deformable element in an oxygen-containing gas other than air so as to reduce the droop.

In yet another embodiment of the invention, a method of making a micromirror device is disclosed. The method comprises: providing a substrate; forming a mirror plate and hinge on a sacrificial material on the substrate such that the mirror plate is attached to the substrate via the hinge; removing the sacrificial material using a vapor phase etchant; and oxidizing the hinge in an oxygen-containing gas other than air.

In yet another embodiment of the invention, a method of making a micromirror device is disclosed. The method comprises: providing a substrate; forming a mirror plate and hinge on a sacrificial material on the substrate such that the mirror plate is attached to the substrate via hinge; removing a portion of the sacrificial material using a vapor phase etchant such that at least a portion of the hinge is exposed; oxidizing the exposed hinge in an oxygen-containing gas other than air; and removing the remaining sacrificial material.

In yet another embodiment of the invention, a method of making a micromirror device, comprising: providing a substrate; depositing a hinge layer and a mirror plate layer on a sacrificial material on the substrate; oxidizing and patterning the hinge layer to form an oxidized hinge; and removing the sacrificial layer.

In yet another embodiment of the invention, a method of making a micromirror device is disclosed. The method comprises: providing a substrate; forming a mirror plate and hinge on a sacrificial layer on the substrate such that the mirror plate is attached to the substrate via the hinge; removing the sacrificial layer; and cleaning and oxidizing the micromirror device, further comprising: providing a gas that is an oxygen-containing gas other than air, the oxygen-containing gas both cleaning and oxidizing at least a volume equivalent to 25% in thickness of the hinge of the micromirror device; and cleaning the hinge using a cleaning agent other than the oxidization gas.

BRIEF DESCRIPTION OF DRAWINGS

While the appended claims set forth the features of the present invention with particularity, the invention, together with its objects and advantages, may be best understood from the following detailed description taken in conjunction with the accompanying drawings of which:

DETAILED DESCRIPTION OF THE EMBODIMENTS

The present invention discloses a method for processing a deformable element of a microstructure by oxidizing the deformable element so as to reduce plastic deformation for improving the lifetime of the microstructure.

Figure 1:
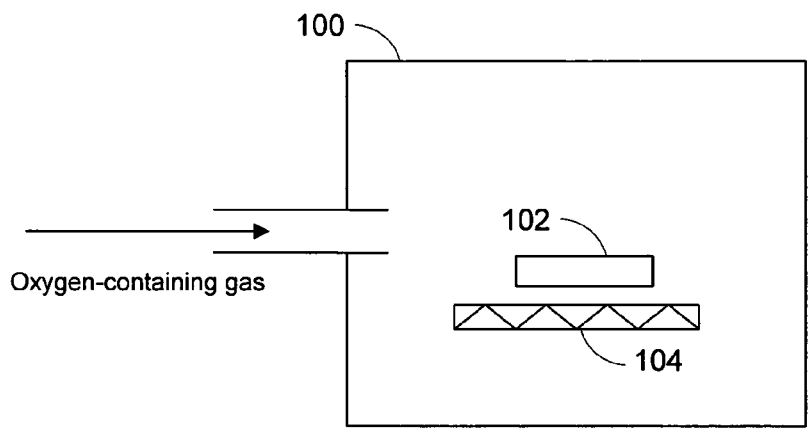
FIG. 1 is a portion of a system for processing a microstructure according to the invention.

Turning to the drawings, FIG. 1 illustrates a portion of a processing system. In order to oxidize a deformable element of microstructure 102, the microstructure is placed in chamber 100. The chamber may be an oven, an etch chamber in which sacrificial materials of the microstructure is removed, or a fabrication chamber in which elements of the microstructure are fabricated (e.g. deposited and patterned). The chamber is connected to an oxygen-containing gas source such that the oxygen-containing gas can flow into the chamber for oxidizing the deformable element of the microstructure.

The oxidation method of the present invention can be employed to oxidize deformable elements composed of a variety of materials that are able to be oxidized. Specifically, the material of the deformable element may be selected from a group comprising: elemental metals, metalloids, metal alloys, intermetallic compounds and ceramics. The elemental metal is preferably a late transition metal and selected from a group comprising Al, Au, Cu, Pt, Co, Ir, Ti and Nb. The metal alloy comprises two or more elemental metals that are preferably later transition metals. Exemplary metal alloys for the structural layers are $AlSc_x$ and $CuBe_x$. Exemplary intermetallic compounds are $Ti_xAl_y$, $Ni_xAl_y$ and $Ti_xNi_y$. It is preferred that the intermetallic compound comprises a late transition metal.

The ceramic is a compound of a metal and a non-metal. The ceramic for the structural layers of the present invention is preferably selected from a group comprising: metalloid nitride (e.g. $SiN_x$), metalloid oxide (e.g. $SiO_2$), metalloid carbide (e.g. $SiC_x$), metalloid oxy-nitride (e.g. $SiO_xN_y$), metal (and preferably transition metal) nitride (e.g. $AlN_x$, $TiN_x$ and $CrN_x$), metal oxide (e.g. $AlO_x$) and preferably transition metal (e.g. $TiO_x$, $TaO_x$ and $CrO_x$), metal (and preferably transition metal) carbide (e.g. $TiC_x$, $TaC_x$ and $CrC_x$), metal (and preferably transition metal) oxy-nitride (e.g. $TiO_xN_y$, $TaO_xN_y$ and $CrO_xN_y$), metal (and preferably transition metal) silicon-nitride (e.g. $TiSi_xN_y$, $TaSi_xN_y$ and $CrSi_xN_y$), and metal (and preferably transition metal) silicon-oxy-nitride (e.g. $TiSi_xO_yN_z$, $TaSi_xO_yN_z$ and $CrSi_xO_yN_z$). It is further preferred than the metal as a composition of the ceramic is a late transition metal, and the ceramic is not WN. The deformable element may also be composed of polycrystalline or amorphous or nanocrystalline materials.

In order to oxidize the deformable element of the microstructure, the gas source connected to the chamber contains oxygen and/or other gaseous agents, such as ozone, water, hydrogen peroxide and acetic acid. The gaseous agent(s) can be energized using for example, downstream plasma. In particular, oxygen plasma can be introduced for oxidizing the deformable element of the microstructure in the chamber.

Heater 104 is placed inside the chamber for adjusting the temperature inside the chamber. Alternatively, the heater can also be placed externally. In another embodiment of the invention, the heater can be built on a package substrate on which the microstructure is held. In yet another embodiment of the invention, rather than providing an external heater like heater 104, the oxidation gas is heated to a desired temperature and introduced into chamber 100. In still yet another embodiment of the invention, an external energy source, such as plasma or ultraviolet light source is provided for adjusting the temperature inside the chamber. According to the invention, the temperature inside the chamber for oxidizing deformable elements is preferably from 100° C. to 500° C., depending upon the pressure inside the chamber, the oxidation agent, the materials of the deformable element and the structure of the deformable element.

As an alternative feature, a pump (not shown) can be provided and connected to the chamber for adjusting the pressure inside the chamber. The processing method of the present invention can be performed under any suitable pressure. The ability of adjusting the pressure inside the chamber can be of more importance when the deformable element is enclosed within an assembly having a micro-opening, pressure or pressure cycle is preferably applied to the chamber to expedite the oxidation. The high and low chamber pressures are alternately applied over time. Consequently, a pressure gradient from the exterior to the interior of the assembly provides the efficient exchange of gas between the assembly and the rest of the chamber.

During the oxidation process within the chamber, the deformable element of the microstructure can be at any desired state, such as a natural resting state, an actuated state or in switching between different states. As a way of example, the hinge to which a mirror plate of a micromirror device is attached is to be oxidized. The oxidization can be performed when the mirror plate is fully rotated to an ON or OFF state. The oxidation can also be performed when the mirror plate is in an intermediate state between the ON and OFF state or while actively switching between the ON and OFF states.

The oxidation of a deformable element of the a microstructure may generally last for a time period of from 1 femtosecond to 500 terahours or more depending upon many factors, such as the environment of the oxidation (e.g. temperature and pressure inside the chamber), the material of the deformable element to be oxidized, the structure of the deformable element and the oxidation agent employed, which will be discussed in detail afterwards. After the oxidization, the electrical resistance of the deformable element is around 2 times or higher, or 4 times or higher than the electrical resistance of the deformable element before oxidization. It is also desired to oxidize an amount of material equivalent to 20% or more, or 40% or more, or 60% or more of the volume within the deformable element.

In the following, embodiments of the present invention will be discussed with reference to processing a micromirror device. It will be understood by those skilled in the art that the following discussion is for demonstration purposes only. It should not be interpreted as a limitation.

Figure 2A:
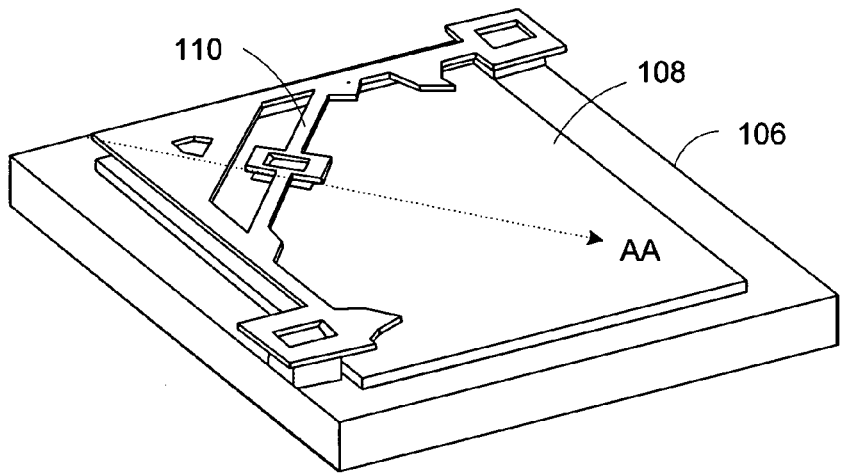
FIG. 2a is a perspective of a portion of an exemplary micromirror device having a deformable hinge to which a mirror plate is attached.

Referring to FIG. 2a, a perspective view of a portion of an exemplary micromirror device is illustrated therein. Hinge 110 is formed on glass substrate 106 that is transmissive to visible light. Mirror plate 108 is attached to the hinge such that the mirror plate can rotate relative to the substrate, which is better illustrated in FIG. 2b. The hinge deforms with the rotation of the mirror plate. The mirror plate may comprise multiple layers, such as a metallic reflective layer and a light transmissive protecting layer for protecting the inner layers of the mirror plate.

Figure 2B:
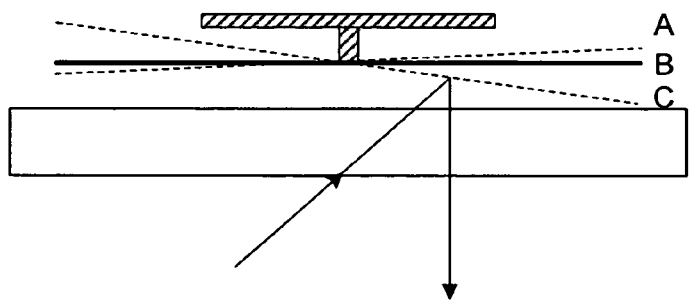
FIG. 2b is a side view of the micromirror device of FIG. 2a showing different rotation positions of the mirror plate.

Referring to FIG. 2b, a side-view of the micromirror device along a diagonal of the mirror plate as represented by dashed line AA in FIG. 2a is illustrated therein. Solid line B in FIG. 2b represents the natural resting state of the mirror plate. The natural resting state can be defined as the OFF state of the micromirror device, in which state the mirror plate of the micromirror reflects incident light away from the display target. Dashed line A represents an alternative OFF state, in which the mirror plate is rotated to an OFF state angle relative to the substrate. The OFF state angle can be of any desired angle, such as an angle of from −0.1° to −8° degrees relative to the substrate. In the OFF state, the mirror plate reflects incident light away from the display target to generate a "dark" pixel. Dashed line C represents an ON state of the micromirror device, in which state the mirror plate is rotated to an ON state angle that can be of any desired angle, such as an angle of from 0 to +18° degrees or more. In the ON state, the mirror plate reflects incident light onto the display target to generate a "bright" pixel.

The micromirror device can be of other suitable configurations. For example, a mirror plate and hinge can be formed on a semiconductor substrate. Specifically, the hinge is formed on a silicon substrate and the mirror plate is formed on hinge.

In operation, the mirror plate switches between the ON and OFF states over time in response to an electrical field. For example, assuming that the ON state angle is +14° degrees and that the OFF state angle is 0° degree (the natural resting state), the mirror plate rotates from 0° to +14° degrees and from +14° degrees to 0° degree over time. This desired rotation may not be achieved when the deformable hinge suffers from plastic deformation. As a consequence, the mirror plate may not rotate back to 0° degree from +14° degrees. Instead, when the electrical field is removed and the mirror plate is expected to return to the 0° degree OFF state angle, the mirror plate will stop at an angle higher than 0° degree. This phenomenon is often referred to as "droop". And the angle is often referred to as "droop angle". Because the change in the plastic deformation of the deformable hinge exceeds a certain amount, the shifts of the OFF state angle will cause an observable change in the displayed images. The plastic deformation can be aggravated, and the droop angle can be accumulated when the micromirror is operated in an oxidizing environment. An accelerated measurement of the droop angle over time is shown in FIG. 3.

Figure 3:
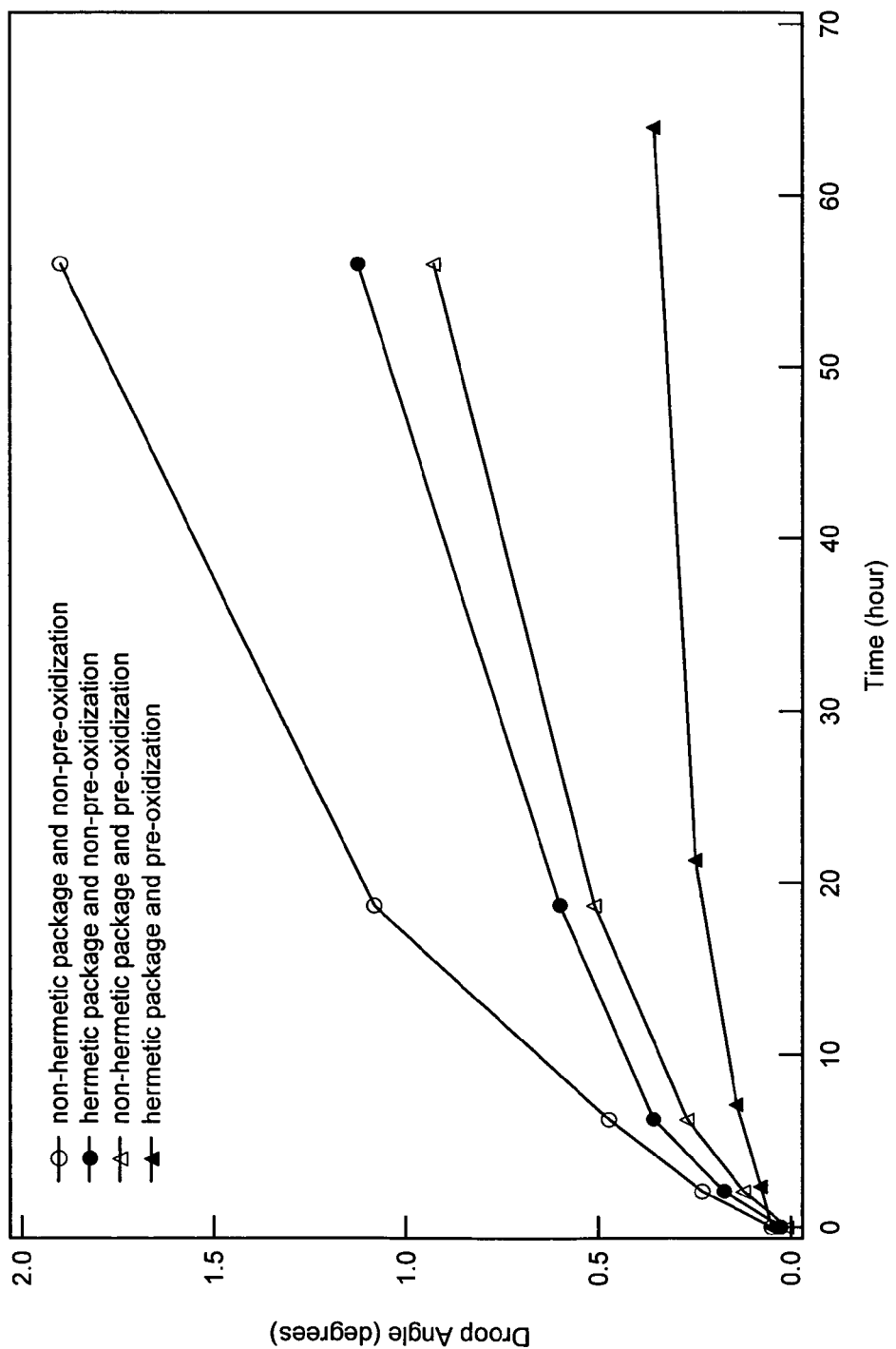
FIG. 3 plots the droop angle versus processing time for different samples at different processing environments.

Referring to FIG. 3, the accelerated measurement is performed for the same micromirrors with and without pre-oxidization and with and without hermetic packaging. The measurements are performed under the same conditions and with the same procedures. The line with open-circle represents the droop angle of the micromirror device that is neither hermetically sealed nor oxidized using the method of the present invention. It can be seen from the figure that the droop angle monotonically increases over time. In this example, the droop angle after 56 hours of the experiment is around 1.9° degrees.

The droop angle can be reduced by hermetic packaging the micromirror device in nitrogen, as illustrated by line with solid-circle. The line with solid-circle represents the droop angle versus time measure from a micromirror that is hermetically packaged but not oxidized using the method of the present invention. The droop angles of the plot are measured in the same way as the line with open circles. It can be seen from the figure that the droop angle also monotonically increases over time. In this example, the droop angle after 56 hours of the experiment is around 1.1° degrees. However, the droop angle is much less than the micromirror without hermetic packaging (plotted in line with open-circles). Specifically, the droop angle of the micromirror inside a hermetic package is reduced by around 40 percent after 56 hours of experiment, and reduced by around 40 percent after 18 hours of experiment.

The droop angle can be further reduced by oxidizing the deformable hinge of the micromirror according to the invention.

In an embodiment of the invention, the deformable hinge of the micromirror is oxidized during the packaging stage before hermetically sealing the package. Specifically, the micromirror device is attached to a package substrate followed by loading the package substrate and the micromirror device attached thereto into the chamber of FIG. 1 in which case is preferably an oven. An oxygen-containing gas is then introduced into the chamber for oxidizing the deformable hinge. The oxygen-containing gas can be selected from a group comprising: ozone, air mixed with water vapor, ozone mixed with vapor water, oxygen mixed with water vapor, oxygen plasma, hydrogen peroxide, acetic acid and other suitable gases that can oxidize the deformable hinge. The hinge may be composed of an elemental metal, metalloid, metal alloy, intermetallic compound or ceramic. The hinge may also be composed of polycrystalline or amorphous or nanocrystalline materials. The oxidization can be performed at a temperature of from 100° C. to 500° C. degrees for a time period of from 2 minutes to 500 hours or more, such as 50 hours or more, or 100 hours or more or 200 or more, or 300 or more. During the oxidization, the mirror plate can be actuated to an angle of the ON or OFF state angle or an intermediate angle between the ON state and OFF state angle. Alternatively, the mirror plate can be switched between the ON and OFF state angles.

During the oxidization, pressure may be applied to the chamber to expedite the oxidization. Specifically, the pressure inside the chamber can range from the vapor pressure to the condensation pressure of the oxygen-containing gas at the given temperature. In a situation that the deformable hinge is enclosed within an assembly having a micro-opening around 10 micrometers or less, a pressure cycle is may be applied to the chamber to expedite the oxidation. The high and low chamber pressures are alternately applied over time. Consequently, a pressure gradient from the exterior to the interior of the assembly provides the efficient exchange of gas between the assembly and the rest of the chamber.

The line with the open-triangles in FIG. 3 plots the droop angle versus actuation time, wherein the micromirror is not hermetically packaged. As plotted in the figure, the droop angle is reduced as compared to the droop angles in micromirrors not oxidized using the method of the present invention. For example, the droop angle after 56 hours of actuation is reduced by around 20 percent, and reduced by around 10 percent after 18 hours of actuation compared to the droop angle from the micromirror device that is hermetically packaged but is not oxidized using the method of the embodiment.

In order to further reduce the plastic deformation of the deformable hinge, the micromirror device can be hermetically packaged. Specifically, the micromirror device is hermetically sealed within the package following the oxidization. An inert gas is preferably filled within the sealed package. The line with the solid-triangles in FIG. 3 plots the droop angle versus experiment time. It can been seen from the plot that the droop angle is further reduced as compared to the droop angles in micromirrors that are oxidized using the method of the embodiment but is not hermetically packaged. For example, the droop angle after 56 hours of oxidization is reduced by around 64 percent, and reduced by around 47 percent after 18 hours of actuation compared to the droop angle from the micromirror device that is not hermetically packaged but is oxidized using the method of the embodiment.

The oxidization of the invention can also be performed before the packaging stage but after the micromirror device is fully released. In this situation, the chamber of FIG. 1 in which the oxidization is performed can be the etching chamber in which the micromirror device is released by removing the sacrificial materials. According to the embodiment, the oxygen-containing gas is introduced into the chamber for oxidizing the deformable hinge after the sacrificial materials are fully removed from the micromirror device and pumped out from the chamber. The same or similar oxidization method (e.g. the pressure, time period, temperature, oxygen-containing gas and actuation state) for oxidizing the micromirror device during the packaging stage can also be applied to oxidize the micromirror device before packaging and after the releasing of the micromirror device.

In another embodiment of the invention, the oxidization of the present invention can be performed during the fabrication of the micromirror device. Specifically, the hinge can be oxidized after the deposition of the hinge layer and before or after the patterning of the oxidized hinge. The hinge can also be oxidized before or during the removing of the sacrificial materials, which will be discussed in detail with reference to FIGS. 4a and 4b, in which the micromirror device of FIG. 2a is fabricated.

Figure 4A:
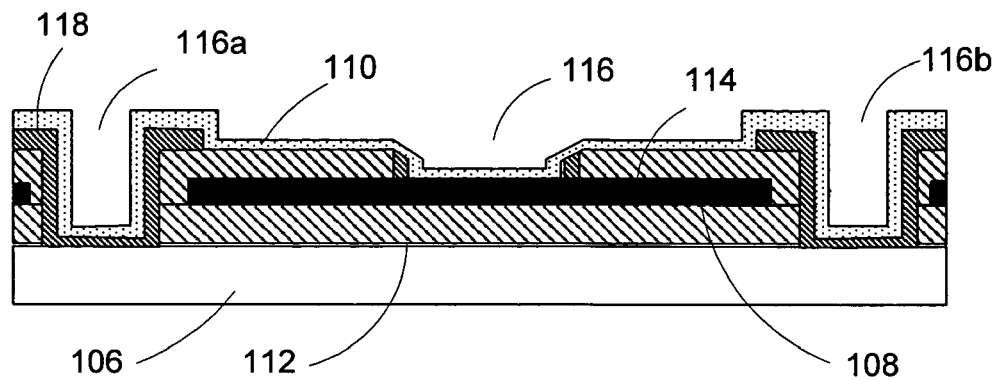
FIG. 4a is a cross-sectional view of the micromirror device of FIG. 2a during an exemplary fabrication process in which an embodiment of the invention may be implemented.
Figure 4B:
FIG. 4b is a cross-sectional view of the micromirror device of FIG. 4a after removal of the sacrificial layers.

Referring to FIG. 4a, glass substrate 106 that is transmissive to visible light is provided. Sacrificial layer 112 is deposited on the substrate followed by deposition and patterning of mirror plate layer 108 to form a mirror plate of a desired shape. Sacrificial layer 114 is then deposited on the mirror plate. The two sacrificial layers are patterned so as to form two posts 116a and 116b and hinge via 116. On the patterned sacrificial layers, hinge support layer 118 is deposited and patterned.

According to an embodiment of the invention, an oxygen-containing gas is introduced to oxidize the hinge layer. The oxidization can be performed after the hinge layer is deposited and before or after the patterning of the hinge layer. The method can also be applied to pre-oxidize a hinge having multiple hinge layers wherein one or more of the hinge layers need to be oxidized. In this situation, the oxidization can be performed for each individual hinge layers that need to be oxidized. Specifically, oxidization can be performed after deposition of such hinge layer and oxidize the hinge layer either before or after patterning the hinge layer. After oxidization, other hinge layer(s) can then be formed thereon. Alternatively, the oxidization can be performed for some or all of the hinge layers that need to be oxidized after these hinge layers are formed.

After the oxidization of the hinge support layer, hinge layer 110 is deposited and patterned on the oxidized hinge support layer. The oxidization can be performed after the hinge layer being deposited and before or after the patterning of the hinge layer.

In another embodiment of the invention, the hinge support layer is not oxidized before the deposition of the hinge layer. The hinge support layer is patterned and oxidized along with the oxidization of the hinge layer either before or after the patterning of the hinge layer.

After forming the hinge layer, the sacrificial layers are removed for releasing the micromirror device. This can be achieved by using selected vapor phase etchant, such as an interhalogen (e.g. bromine fluorides), a noble gas halide (e.g. $XeF_2$) or HF or other suitable etching methods, such as etching techniques using energized (e.g. plasma) etchants.

In yet another embodiment of the invention, the hinge and the hinge support layer are oxidized during the release process. Specifically, the oxidization is performed following the removal of a portion of the sacrificial layers. It is preferred that after the oxidization, the electrical resistance of the hinge is around 2 times or higher, or 4 times or higher than the resistance of the hinge before oxidization.

In the above discussed examples of the invention, it is preferred that after the oxidization, the electrical resistance of the hinge is around 2 times or higher, or 4 times or higher than the electrical resistance of the deformable hinge before oxidization. Alternatively, it is desired to oxidize an amount of material equivalent to 20% or more, or 40% or more, or 60% or more of the volume of the hinge. After oxidization, the remaining sacrificial layers are totally removed.

In the above discussion, the oxidization is performed during the fabrication of the micromirror structure of FIG. 2a. It will be appreciated by those skilled in the art that the above discussion is for demonstration purposes only. Instead, the oxidization of the present invention can be applied to other microstructures, such as microelectromechanical devices having deformable elements. The method of the invention can also be performed during fabrication of other type of micromirror devices. For example, the oxidization can be performed during fabrication of a microstructure that comprises a semiconductor substrate, a hinge formed on the semiconductor substrate and a mirror plate on the hinge and attached to the substrate via the hinge.

It will be appreciated by those of skill in the art that a new and useful processing method for oxidizing a deformable element of a microstructure has been described herein. In view of many possible embodiments to which the principles of this invention may be applied, however, it should be recognized that the embodiments described herein with respect to the drawing figures are meant to be illustrative only and should not be taken as limiting the scope of invention. For example, those of skill in the art will recognize that the illustrated embodiments can be modified in arrangement and detail without departing from the spirit of the invention. Therefore, the invention as described herein contemplates all such embodiments as may come within the scope of the following claims and equivalents thereof.

I claim:

1. A method for processing a deformable element of a microstructure, comprising:
   deflecting the deformable element with an electrostatic field; and
   oxidizing the deformable element in an oxygen-containing gas other than air while the deformable element is in the deflected state.

2. The method of claim 1, wherein the deflected deformable element is a hinge of a micromirror device that further comprises a mirror plate attached to the hinge on a substrate of the micromirror device.

3. The method of claim 2, wherein the step of deflecting the deformable element further comprises: deflecting the deformable element to an ON state that corresponds to a state wherein the mirror plate is rotated to an ON state angle of from 10° to 18° in a first rotation direction relative to the substrate.

4. The method of claim 2, wherein the step of deflecting the deformable element further comprising: deflecting the deformable element to an OFF state that corresponds to a state wherein the mirror plate is rotated to an OFF state angle of from −0.1° to −8° relative to the substrate.

5. The method of claim 1, wherein the gas comprises more oxygen than is generally present in air.

6. The method of claim 1, wherein the oxygen-containing gas comprises ozone.

7. The method of claim 1, wherein the oxygen-containing gas comprises air mixed with $H_2O$.

8. The method of claim 1, wherein the oxygen-containing gas comprises ozone mixed with $H_2O$.

9. The method of claim 1, wherein the oxygen-containing gas comprises oxygen mixed with $H_2O$.

10. The method of claim 1, wherein the oxygen-containing gas is oxygen plasma.

11. The method of claim 1, wherein the oxygen-containing gas comprises hydrogen peroxide.

12. The method of claim 1, wherein the oxygen-containing gas comprises acetic acid.

13. The method of claim 1, wherein the oxidization is performed at a temperature of from 100° C. to 500° C.

14. The method of claim 13, wherein the step of oxidizing further comprises: exposing the deformable element in the oxygen-containing gas for 1 minute to 500 hours or more.

15. The method of claim 14, wherein the step of oxidizing further comprises: exposing the deformable element in the oxygen-containing gas for 50 hours or more.

16. The method of claim 14, wherein the step of oxidizing further comprises: exposing the deformable element in the oxygen-containing gas for 100 hours or more.

17. The method of claim 1, wherein the step of oxidizing further comprises: oxidizing an element of the microstructure, wherein the element comprises a material that is an elemental metal, metalloid or metallic compound.

18. The method of claim 1, wherein the step of oxidizing further comprises: oxidizing an element of the microstructure, wherein the element comprises a material that is a ceramic.

19. The method of claim 1, wherein the step of oxidizing further comprises: oxidizing an element of the microstructure, wherein the element comprises a material that is polycrystalline.

20. The method of claim 1, wherein the step of oxidizing further comprises: oxidizing an element of the microstructure, wherein the element comprises a material that is amorphous.

21. The method of claim 1, wherein the step of oxidizing further comprises: oxidizing an element of the microstructure, wherein the element comprises a material that is nanocrystalline.

22. The method of claim 1, wherein the step of oxidizing further comprises oxidizing an amount of the material equivalent to 20% or more of the volume of the deformable element.

23. The method of claim 1, wherein the step of oxidizing further comprises oxidizing an amount of the material equivalent to 50% or more of the volume of the deformable element.

24. The method of claim 1, wherein the step of oxidizing further comprises: oxidizing the element such that the electrical resistance of the element after oxidization is two times or more of the electrical resistance before oxidization.

25. The method of claim 1, wherein the step of oxidizing further comprises: oxidizing the element such that the electrical resistance of the element after oxidization is four times or more of the electrical resistance before oxidization.

26. The method of claim 1, wherein the mirror plate comprises:
   a metallic reflective layer; and
   a light transmissive protecting layer for protecting oxidization of the mirror plate during operation.

27. A method of processing a deflectable element of a microelectromechanical device, the method comprising:
   oxidizing an amount of a material of the deflectable element equivalent to at least 20 percent of the volume of the deflectable element by exposing the deflectable element in an oxygen-containing gas other than air.

28. The method of claim 27, wherein the deformable element is a hinge of a micromirror device that further comprises a substrate and a mirror plate that is attached to the hinge such that the mirror plate is operable to rotate on the substrate, and wherein the oxidizing of the hinge reduces changes in a rest state of the mirror plate over time.

29. The method of claim 27, wherein the step of oxidizing further comprises:
   oxidizing the material of the deformable element at a temperature of from 100° C. to 500° C.

30. The method of claim 29, wherein the step of oxidizing the material of the deformable element further comprises:
   oxidizing an amount of the material of the deformable element equivalent to at least 60 percent of the volume of the deformable element.

31. The method of claim 29, wherein the step of oxidizing the material of the deformable element further comprises:
oxidizing the deformable element such that the plastic deformation of the deformable element is reduced by at least 20 percent after a time period of from 2 minutes to 10,000 hours.

32. The method of claim 27, further comprising:
introducing the oxygen-containing gas to the deformable element through a micro-opening of an assembly in which the deformable element is encapsulated, wherein the micro-opening has a dimension around 10 micrometers or less.

33. The method of claim 32, wherein the step of introducing the oxygen-containing gas further comprises:
   a) loading the assembly into a chamber;
   b) introducing a first component of the oxygen-containing gas with a first pressure into the chamber; and
   c) introducing a second component of the oxygen-containing gas with a second pressure higher than the first pressure into the chamber.

34. The method of claim 33, further comprising:
   pumping out the chamber such that the pressure inside the chamber is lower than the first pressure; and
   repeating the steps b) and c).

35. The method of claim 27, wherein the oxygen-containing gas comprises ozone.

36. The method of claim 27, wherein the oxygen-containing gas comprises air mixed with $H_2O$.

37. The method of claim 27, wherein the oxygen-containing gas comprises ozone mixed with $H_2O$.

38. The method of claim 27, wherein the oxygen-containing gas comprises oxygen mixed with $H_2O$.

39. The method of claim 27, wherein the oxygen-containing gas is oxygen plasma.

40. The method of claim 27, wherein the oxygen-containing gas comprises hydrogen peroxide.

41. The method of claim 27, wherein the oxygen-containing gas comprises acetic acid.

42. The method of claim 27, wherein the step of oxidizing further comprises: oxidizing the deformable element that comprises a material that is an elemental metal, metalloid, ceramic or metallic compound.

43. The method of claim 27, wherein the step of oxidizing further comprises: oxidizing the deformable element comprising a material that is selected from a group comprising: polycrystalline, amorphous and nanocrystalline.

44. The method of claim 27, wherein the step of oxidizing further comprises: oxidizing the element such that the electrical resistance of the element alter oxidization is two times or more of the electrical resistance before oxidization.

45. The method of claim 44, wherein the step of oxidizing further comprises: oxidizing the element such that the electrical resistance of the element after oxidization is four times or more of the electrical resistance before oxidization.

46. A method of making a micromirror device, comprising:
   providing a substrate;
   forming a mirror plate and hinge on a sacrificial material on the substrate such that the mirror plate is attached to the substrate via the hinge, further comprising:
      depositing a first sacrificial layer on the substrate;
      forming a hinge on the first sacrificial layer;
      depositing a second sacrificial layer; and
      forming a mirror plate on the second sacrificial layer;
   removing the sacrificial material using a vapor phase etchant; and
   oxidizing the hinge in an oxygen-containing gas other than air.

47. The method of claim 46, wherein the vapor phase etchant comprises an interhalogen.

48. The method of claim 46, wherein the vapor phase etchant comprises a noble gas halide.

49. The method of claim 48, wherein the noble gas halide is xenon difluoride.

50. The method of claim 46, wherein the step of forming the mirror plate and hinge further comprises:
depositing a first sacrificial layer on the substrate,
forming a mirror plate on the first sacrificial layer;
depositing a second sacrificial layer; and
forming a hinge on the second sacrificial layer.

51. The method of claim 46, wherein the gas comprises more oxygen than is generally presented in air.

52. The method of claim 46, wherein the oxygen-containing gas comprises ozone.

53. The method of claim 46, wherein the oxygen-containing gas comprises air mixed with $H_2O$.

54. The method of claim 46, wherein the oxygen-containing gas comprises ozone mixed with $H_2O$.

55. The method of claim 46, wherein the oxygen-containing gas comprises oxygen mixed with $H_2O$.

56. The method of claim 46, wherein the oxygen-containing gas is oxygen plasma.

57. The method of claim 46, wherein the oxygen-containing gas comprises hydrogen peroxide.

58. The method of claim 46, wherein the oxygen-containing gas comprises acetic acid.

59. The method of claim 46, wherein the oxidization is performed at a temperature of from 300° C. to 500° C.

60. The method of claim 46, wherein the hinge comprises a material that is an elemental metal, metalloid or metallic compound.

61. The method of claim 46, wherein the hinge comprises a material that is ceramic.

62. The method of claim 46, wherein the hinge comprises a material that is polycrystalline.

63. The method of claim 46, wherein the hinge comprises a material that is amorphous.

64. The method of claim 46, wherein the step of oxidizing further comprises: oxidizing an amount of a material of the hinge equivalent to 20% or more in volume of the hinge.

65. The method of claim 46, wherein the step of oxidizing further comprises oxidizing an amount of a material of the hinge equivalent to 50% or more in volume of the hinge.

66. The method of claim 46, wherein the step of oxidizing further comprises: oxidizing the element such that the electrical resistance of the hinge after oxidization is two times or more of the electrical resistance before oxidization.

67. The method of claim 46, wherein the step of oxidizing further comprises: oxidizing the binge such that the electrical resistance of the element after oxidization is four times or more of the electrical resistance before oxidization.

68. A method of making a micromirror device, comprising:
providing a substrate;
forming a mirror plate and hinge on a sacrificial material on the substrate such that the mirror plate is attached to the substrate via hinge;
removing a portion of the sacrificial material using a vapor phase etchant such that at least a portion of the hinge is exposed;
deflecting the hinge to a deflected state with an electrostatic field;
oxidizing the exposed hinge in an oxygen-containing gas other than air at the deflected state; and
removing the remaining sacrificial material.

69. The method of claim 68, wherein the step of forming the mirror plate and hinge further comprises:
depositing a first sacriflciai layer on the substrate;
forming a mirror plate on the first sacrificial layer;
depositing a second sacrificial layer; and
forming a hinge on the second sacrificial layer.

70. The method of claim 68, wherein the step of forming the mirror plate and hinge further comprises:
depositing a first sacrificial layer on the substrate;
forming a hinge on the first sacrificial layer;
depositing a second sacrificial layer; and
forming a mirror plate on the second sacrificial layer.

71. The method of claim 68, wherein the gas comprises more oxygen than is generally presented in air.

72. The method of claim 68, wherein the oxygen-containing gas comprises ozone.

73. The method of claim 68, wherein the oxygen-containing gas comprises air mixed with $H_2O$.

74. The method of claim 68, wherein the oxygen-containing gas comprises ozone mixed with $H_2O$.

75. The method of claim 68, wherein the oxygen-containing gas comprises oxygen mixed with $H_2O$.

76. The method of claim 68, wherein the oxygen-containing gas is oxygen plasma.

77. The method of claim 68, wherein the oxygen-containing gas comprises hydrogen peroxide.

78. The method of claim 68, wherein the oxygen-containing gas comprises acetic acid.

79. The method of claim 68, wherein the oxidization is performed at a temperature of from 300° C. or more.

80. The method of claim 68, wherein the hinge comprises a material that is an elemental metal, metalloid or metallic compound.

81. The method of claim 68, wherein the hinge comprises a material of $SiN_x$, $TiN_x$ or $TiSi_xNy$.

82. The method of claim 68, wherein the hinge comprises a material that is polycrystalline.

83. The method of claim 68, wherein the hinge comprises a material that is amorphous.

84. The method of claim 68, wherein the step of oxidizing further comprises oxidizing an amount of a material of the hinge equivalent to 70% or more in volume of the hinge.

85. The method of claim 68, wherein the step of oxidizing further comprises:
oxidizing the element such that the electrical resistance of hinge after oxidization is six times or more of the electrical resistance before oxidization.

86. The method of claim 68, wherein the step of oxidizing further comprises:
oxidizing the hinge such that the electrical resistance of the element after oxidization is eight times or more of the electrical resistance before oxidization.

87. The method of claim 68, wherein the gas etchant comprises $XeF_2$.

88. A method of making a micromirror device, comprising:
providing a substrate;
depositing a hinge layer and a mirror plate layer on a sacrificial material on the substrate;
oxidizing and patterning the hinge layer to form an oxidized hinge; and
removing the sacrificial layer after the step of oxidizing.

89. The method of claim 88, wherein the step of patterning is performed before oxidizing the hinge layer.

90. The method of claim 88, wherein the step of patterning is performed after oxidizing the hinge layer.

91. The method of claim 88, wherein the step of oxidizing the hinge further comprises: oxidizing the hinge in an oxygen-containing gas.

92. The method of claim 89, wherein the gas comprises more oxygen than is generally presented in air.

93. The method of claim 89, wherein the oxygen-containing gas comprises ozone.

94. The method of claim 89, wherein the oxygen-containing gas comprises air mixed with $H_2O$.

95. The method of claim 89, wherein the oxygen-containing gas comprises ozone mixed with $H_2O$.

96. The method of claim 89, wherein the oxygen-containing gas comprises oxygen mixed with $H_2O$.

97. The method of claim 89, wherein the oxygen-containing gas is a downstream oxygen plasma.

98. The method of claim 89, wherein the oxygen-containing gas comprises hydrogen peroxide.

99. The method of claim 89, wherein the oxygen-containing gas comprises acetic acid.

100. The method of claim 89, wherein the hinge comprises a material that is an elemental metal, metalloid or metallic compound.

101. The method of claim 89, wherein the hinge comprises a material that is ceramic.

102. The method of claim 89, wherein the hinge comprises a material that is polycrystalline.

103. The method of claim 102, wherein the hinge comprises a material that is amorphous.

104. The method of claim 89, wherein the step of oxidizing further comprises oxidizing 20% or more in thickness of the hinge.

105. A method of making a micromirror device, comprising:
   providing a substrate;
   forming a mirror plate and hinge on a sacrificial layer on the substrate such that the mirror plate is attached to the substrate via the hinge;
   removing the sacrificial layer; and
   cleaning and oxidizing the micromirror device, further comprising:
      providing a gas that is an oxygen-containing gas other than air, the oxygen-containing gas cleaning the micromirror and oxidizing an amount of the material of the hinge equivalent to at least 25% in volume of the hinge.

106. The method of claim 105, wherein the oxygen-containing gas comprises ozone.

107. The method of claim 105, wherein the oxygen-containing gas comprises air mixed with $H_2O$.

108. The method of claim 105, wherein the oxygen-containing gas comprises ozone mixed with $H_2O$.

109. The method of claim 105, wherein the oxygen-containing gas comprises oxygen mixed with $H_2O$.

110. The method of claim 105, wherein the oxygen-containing gas is oxygen plasma.

111. The method of claim 105, wherein the oxygen-containing gas comprises hydrogen peroxide.

112. The method of claim 105, wherein the oxygen-containing gas comprises acetic acid.

113. The method of claim 105, wherein the hinge comprises a material that is an elemental metal, metalloid or metallic compound.

114. The method of claim 105, wherein the hinge comprises a material that comprises titanium and aluminum.

115. The method of claim 105, wherein the hinge comprises a material that is polycrystalline.

116. A method for processing a deformable element of a microstructure, comprising:
   deflecting the deformable element; and
   oxidizing the deformable element in an oxygen-containing gas other than air while the deformable element is in the deflected state, further comprising:
      oxidizing an amount of the material equivalent to 20% or more of the volume of the deformable element.

117. A method for processing a deformable element of a microstructure, comprising:
   deflecting the deformable element; and
   oxidizing the deformable element in an oxygen-containing gas other than air while the deformable element is in the deflected state, further comprising:
      oxidizing the element such that the electrical resistance of the element after oxidization is two times or more of the electrical resistance before oxidization.

* * * * *